United States Patent [19]

Kawabe et al.

[11] Patent Number: 5,534,382
[45] Date of Patent: Jul. 9, 1996

[54] POSITIVE PHOTORESIST COMPOSITION

[75] Inventors: Yasumasa Kawabe; Kenichiro Sato, both of Shizuoka, Japan

[73] Assignee: Fuji Photo Film Co., Ltd., Kanagawa, Japan

[21] Appl. No.: 411,209

[22] Filed: Mar. 27, 1995

[30] Foreign Application Priority Data

Apr. 7, 1994 [JP] Japan ................................. 6-069710

[51] Int. Cl.$^6$ .............................. G03F 7/021; G03F 7/30
[52] U.S. Cl. ........................ 430/192; 430/165; 430/191; 430/193; 534/557
[58] Field of Search ..................... 430/165, 192, 430/191, 193, 190; 534/557

[56] References Cited

U.S. PATENT DOCUMENTS

| | | | |
|---|---|---|---|
| 4,123,279 | 10/1978 | Kobayashi | 430/165 |
| 5,188,920 | 2/1993 | Moriuma et al. | 430/191 |
| 5,238,771 | 8/1993 | Goto et al. | 430/165 |
| 5,279,917 | 1/1994 | Adachi et al. | 430/193 |
| 5,326,665 | 7/1994 | Osaki et al. | 430/192 |

FOREIGN PATENT DOCUMENTS

| | | |
|---|---|---|
| 4-365046 | 12/1992 | Japan . |
| 5-19466 | 1/1993 | Japan . |

*Primary Examiner*—John S. Y. Chu
*Attorney, Agent, or Firm*—Sughrue, Mion, Zinn, Macpeak & Seas

[57] ABSTRACT

Disclosed is a positive photoresist composition comprising an alkali-soluble resin and the 1,2-naphthoquinonediazido-5-(and/or -4-)sulfonate acid ester of a polyhydroxy compound represented by formula (I):

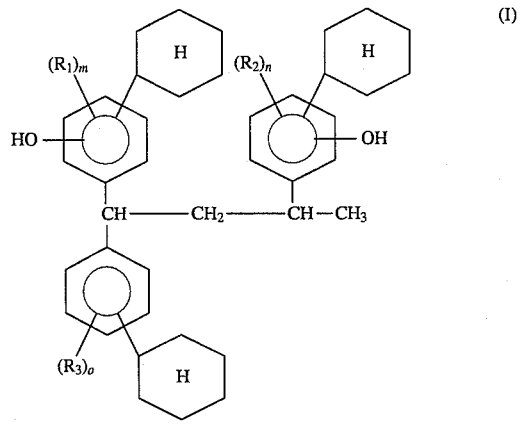

wherein $R_1$ to $R_3$ may be the same or different and each represents a hydrogen atom, a halogen atom, a hydroxyl group, an alkyl group, or an alkoxy group; and m, n and o each represent an integer of from 1 to 3. The photoresist composition has a high resolving power and a less layer thickness reliance of the resolving power, and a wide development latitude, is reluctant to form a development residue, and further has a very excellent storage stability, and does not deposit the photosensitive material and does not form microgels, i.e., shows no increase in the particles, with the passage of time.

6 Claims, No Drawings

POSITIVE PHOTORESIST COMPOSITION

FIELD OF THE INVENTION

The present invention relates to a positive photoresist composition containing an alkali-soluble resin and a 1,2-quinonediazide compound and sensitive to radiations such as ultraviolet rays, far-ultraviolet rays, X-rays, electron beams, molecular beams, γ-rays, synchrotron radiations, etc., and, more specifically, to a positive photoresist for fine working, which gives a high resolving power regardless of the fluctuation of the layer thickness, gives less occurrence of a development residue, and is excellent in the development latitude.

The positive photoresist of the present invention is coated on a substrate such as a semiconductor wafer, a glass plate, a ceramic sheet, a metal foil, etc., at a thickness of from 0.5 to 2 μm by a spin coating method or a roller coating method. Thereafter, the coated layer is dried by heating, a circuit pattern, etc., is printed thereon by the irradiation of ultraviolet rays, etc., through an exposure mask, and after, if necessary, applying thereto baking, the exposed layer is developed to form positive images.

Furthermore, by etching the substrate using the positive images as a mask, a pattern-form working can be applied onto the substrate. As typical application fields, there are the production steps of semiconductor devices such as IC, etc., the production steps of circuit substrates for a liquid crystal, a thermal head, etc., photofabrication steps, etc.

BACKGROUND OF THE INVENTION

As a positive photoresist composition, a composition containing an alkali-soluble resin binder such as novolak resin, etc., and a naphthoquinonediazide compound as a photosensitive material is generally used.

Since the novolak resin as the binder is soluble in an aqueous alkali solution without being swelled therewith and also when the images formed are used as a mask for etching, the resin gives a high durability to the images against plasma etching, the novolak resin is particularly useful for the use of the present invention.

Also, the naphthoquinonediazide compound being used as the photosensitive material is a unique material in the point that the compound itself functions as a dissolution inhibitor for lowering the alkali solubility of a novolak resin but when the compound is decomposed by irradiated with light, an alkali-soluble material is formed to rather increase the alkali solubility of the novolak resin, and owing to the large change of the property by the action of light, the naphthoquinonediazide compound is particularly useful as the photosensitive material for a positive photoresist.

Hitherto, from such view points, many positive photoresists each containing the novolak resin and the naphthoquinonediazide series resin have been developed and practically used. In particular, the progress of the resist materials toward a high resolving power is remarkable and sufficient results have obtained in line width working up to submicrons.

Hitherto, for increasing the resolving power and obtaining an image reproduction of good pattern form, a resist having a high contrast (γ value) has been considered to be useful and the technical development of resist compositions meeting such a purpose has been made. There are many publications disclosing such techniques. In particular, in regard to the novolak resin which is the main portion of positive photoresist, there are many patent applications on the monomer components, the molecule weight distributions, the synthesis methods, etc., and good results have been obtained. Also, in regard to the photosensitive material which is another main component in the present invention, compounds of many structures which are effective in obtaining a high contrast are disclosed. When a positive photoresist is prepared by utilizing these techniques, it has been able to develop a superhigh resolving power resist which can resolve a pattern of the dimension in the same degree as that of the wavelength of light.

However, an integrated circuit has more and more increased the integrated degree and in the production of a semiconductor substrate such as a very large scale integrated circuit (VLSI), etc., it has become necessary to work a ultra fine pattern composed of a line width such as 0.5 μm or thinner. In such a use, a photoresist which stably obtains particularly high resolving power and has a wide development latitude for always ensuring a constant worked line width has been required. Also, it has been required that a resist residue does not form on the pattern of the resist after development for preventing the working defect of the circuit formed.

Also, in the formation of, in particular, a ultra fine pattern of 0.5 μm or thinner, it has been found that, for example, even when a definite resolving power is obtained by a certain coated layer thickness, there is a phenomenon of deteriorating the resolving power obtained by slightly changing only the coated layer thickness (hereinafter, the phenomenon is referred to as "layer thickness reliance"). Astonishingly, it has also been found that even when the layer thickness slightly changes only several μm-hundredths, the resolving power is largely changed and any typical positive photoresists commercially available at present have such a tendency more or less. Practically, when the thickness of the resist layer before light exposure changes in the range of λ/4n (wherein λ is an exposure wavelength and n is the refractive index of the resist layer in the wavelength) to a definite layer thickness, the resolving power obtained thereby fluctuates.

As to the problem of the layer thickness reliance, the existence is indicated, e.g., by *SPIE Proceedings*, Vol. 1925, 626(1993) and it is described therein that the existence of the layer thickness reliance is caused by the multilayer reflection effect of light in the resist layer.

In the case of practically working a semiconductor substrate, a pattern is formed using a resist layer coated with a finely different layer thickness per positions by the unevenness of the surface of the substrate and the unevenness of the coated layer thickness. Accordingly, in the case of practicing fine working near the limit of the resolution using a positive photoresist, the layer thickness reliance has been one of hindrances.

Hitherto, for increasing the resolving power, many 1,2,-naphthoquinonediazide compounds of polyhydroxy compounds having specific structures are proposed. For example, these compound are disclosed in JP-A-57-63526, JP-A-60-163043, JP-A-62-10645, JP-A-62-10646, JP-A-62-150245, JP-A-63-220139, JP-A-64-76047, JP-A-1-189644, JP-A-2-285351, JP-A-2-296248, JP-A-2-296249, JP-A-3-48249, JPA-3-48250, JP-A-3-158856, JP-A-3-228057, and JP-A-4-365046 (the term "JP-A" as used herein means an "unexamined published Japanese patent application"), Patent Kohyo (PCT Japanese patent unexamined publication) No. 4-502519, U.S. Pat. Nos. 4,957,846, 4,992,356, 5,151,340, and 5,178,986, European Patent 530,148, etc.

However, even by using these photosensitive materials, the positive photoresists are yet insufficient in the view point of the reduction of the layer thickness reliance.

On the other hand, it is described, e.g., in JP-B-37-18015 (the term "JP-B" as used herein means an "examined Japanese patent publication"), JP-A-58-150948, JP-A-2-19846, JP-A-2-103543, JP-A-3-228057, and JP-A-5-323597, European Patent 573,056, U.S. Pat. Nos. 3,184,310, 3,188,210, 3,130,047, 3,130,048, 3,130,049, 3,102,809, 3,061,430, and 3,180,733, West German Patent 938,233, *SPIE Proceedings*, Vol. 631, page 210, ibid., Vol. 1672, 231(1992), ibid., Vol. 1672, 262(1992), and ibid., Vol. 1925, 227(1993) that by utilizing a photosensitive material having a hydroxy group in the molecule, a resist having a high contrast and a high resolving power is obtained. Surely the photosensitive materials described in these publications are effective in elevating the contrast of resists containing them, but these are still insufficient in reducing the layer thickness reliance.

As described above, the manner of designing the composition of a resist material for reducing the layer thickness reliance and obtaining a high resolving power regardless of the layer thickness has not hitherto been known.

Also, with the increase of the integration of a semiconductor device, the requirement of a positive photoresist for particles has been more and more increased. As the term "1/10 rule" is generally said in the field of semiconductor, the particles of the size of larger than 1/10 of the smallest line wide of a semiconductor device give a bad influence on the yield of the device (*Ultraclean Technology*, Vol. 3, No. 1, 79(1991), etc.).

For reducing the particles, a means of using a superfine filter having a pore size of from 0.1 μm to 0.05 μm, etc., has been made at the production of photoresists and the means is useful for reducing the particles in the production of photoresists.

However, even when, for example, particles are less at the production of photoresists, it frequently happens that particles are increased in photoresists with the passage of time. The increase of particles in the photoresists with the passage of time is almost caused by a 1,2-quinonediazide photosensitive material and various investigations have hitherto been made for preventing the increase of particles with the passage of time.

For example, a method of using a photosensitive material obtained by acylating or sulfonylating a part of hydroxy groups of a polyhydroxy compound as disclosed in JP-A-62-178562, a method of using a mixture of a 1,2-naphthoquinonediazido-4-sulfonic acid ester and a 1,2-naphthoquinonediazido-5-sulfonic acid ester as disclosed in JP-A-62-284354, a method of using a thermally denatured 1,2-naphthoquinonediazide photosensitive material as disclosed in JP-A-63-113451, a method of reducing the residual catalyst in a photosensitive material as disclosed in JP-A-63-236030, a method of synthesizing a photosensitive material in the presence of an anion-exchange resin as disclosed in JP-A-63-236031, a method of mixing a photosensitive material with a solvent having an excellent solubility for the photosensitive material as disclosed in JP-A-61-260239 and JP-A-1-293340, etc., have hitherto been tried.

SUMMARY OF THE INVENTION

The first object of the present invention is, therefore, to provide a positive photoresist composition for super fine working having a high resolving power and having a less layer thickness reliance of the resolving power. In addition, in the present invention, the term "layer thickness reliance" means the fluctuation of the resolving power of a photoresist obtained by light-exposing, (baking, if necessary), and developing the photoresist when the thickness of the photoresist layer before the light exposure changes in the range of $\lambda/4n$.

The second object of the present invention is to provide a positive photoresist having a wide development latitude and being reluctant to form a development residue. In this case, the development latitude can be shown by the development time reliance of a resist line width obtained by developing the photoresist or the temperature reliance of a developer. Also, the development residue means a slight amount of a resist insoluble matter remaining between the fine patterns after development, which can be observed by a scanning type electron microscope, etc.

The third object of the present invention is to provide a positive photoresist composition having a very excellent storage stability, which does not deposit the photosensitive material and does not form microgels with the passage of time, that is, does not show the increase of particles.

We, the present inventors, paying attention to the above-mentioned various characteristics of photoresists, assiduously studied various components constituting photoresists and, as a result, have found that the above-mentioned objects may be attained by a combination of an alkali-soluble resin and a quinonediazide compound having a particular skeleton structure. On the basis of this finding, we have completed the present invention.

Specifically, the objects of the present invention have been attained by a positive photoresist composition comprising an alkali-soluble resin and as a photosensitive compound the 1,2-naphthoquinonediazido-5- (and/or -4)-sulfonate acid ester of a polyhydroxy compound represented by formula (I):

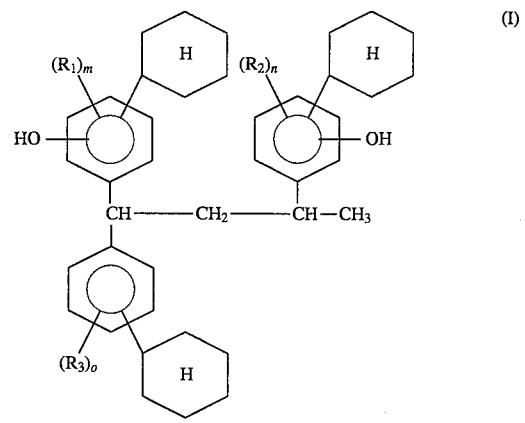

wherein $R_1$ to $R_3$ may be the same or different and each represents a hydrogen atom, a halogen atom, a hydroxyl group, an alkyl group, or an alkoxy group; and m, n and o each represent an integer of from 1 to 3.

DETAILED DESCRIPTION OF THE INVENTION

The present invention will be described in detail hereunder.

For $R_1$, $R_2$ and $R_3$ in formula (I), the halogen atom is preferably a chlorine atom, a bromine atom or an iodine atom; and the alkyl group is preferably an alkyl group having from 1 to 4 carbon atoms, such as methyl group, ethyl group, propyl group, isopropyl group, n-butyl group, isobutyl group, sec-butyl group or tert-butyl group, especially preferably methyl group.

The alkoxy group is preferably an alkoxy group having from 1 to 4 carbon atoms, such as methoxy group, ethoxy group, propoxy group, isopropoxy group, n-butoxy group, isobutoxy group, sec-butoxy group or t-butoxy group, especially preferably methoxy group.

As specific examples of the polyhydroxy compounds having the structure of formula (I), mentioned are compounds of the following formulae [I-1] to [I-6], which, however, are not limitative. These polyhydroxy compounds are used singly or as a combination of two or more of them.

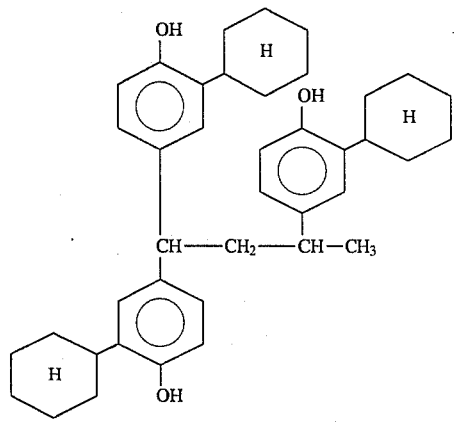

[I-1]

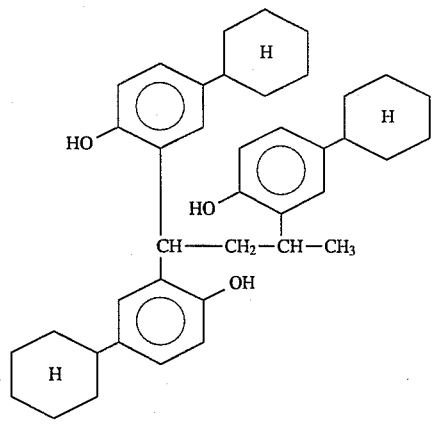

[I-2]

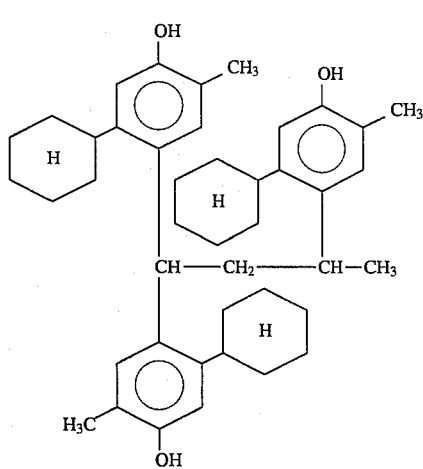

[I-3]

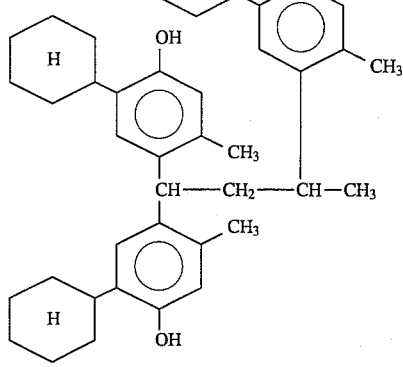

[I-4]

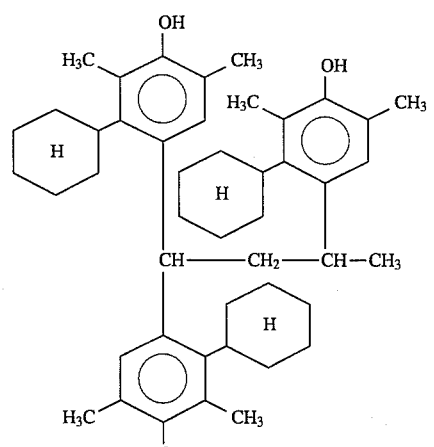

[I-5]

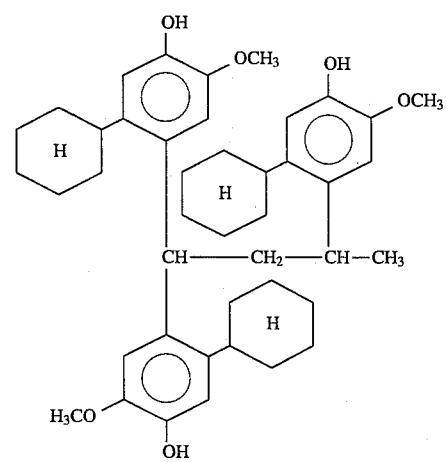

[I-6]

The compounds of the above-mentioned formula (I) are obtained, for example, by the method described in JP-A-62-28394 in which a cyclohexylphenol derivative represented by formula (II) is reacted with crotonaldehyde.

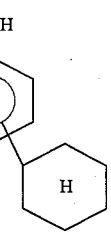

(II)

wherein $R_4$'s may be the same or different and each represents a hydrogen atom, a halogen atom, a hydroxyl group, an alkyl group or an alkoxy group; and m' represents an integer of from 1 to 3.

The photosensitive material for use in the present invention can be obtained, for example, by reacting the above-mentioned polyhydroxyl compound and 1,2-naphthoquinonediazido-5- (and/or -4-)sulfonyl chloride(s) by esterification in the presence of a basic catalyst.

Precisely, predetermined amounts of the polyhydroxy compound and 1,2-naphthoquinonediazido-5- (and/or -4-)sulfonyl chloride(s) are put into a flask along with a solvent, such as dioxane, acetone, tetrahydrofuran, methyl ethyl ketone, N-methylpyrrolidone, chloroform, trichloroethane, dichloroethane, γ-butylolactone, etc., and these are condensed while a basic catalyst, such as sodium hydroxide, sodium carbonate, sodium hydrogencarbonate, triethylamine, 4-dimethylaminopyridine, 4-methylmorpholine, N-methylpiperazine, N-methylpiperidine, etc., is dropwise added thereto. The product thus obtained is crystallized in water, washed with water, then purified and dried.

According to ordinary esterification of these compounds, a mixture of esters which differ in the degree of esterification and in the esterified position. However, if a specifically-selected esterification condition is employed or a polyhydroxy compound having a specifically-selected structure is used, it is possible to obtain only a specifically-selected ester isomer. The degree of esterification as referred to herein is defined as the mean value of the ester mixture obtained by the esterification.

The degree of esterification thus defined can be controlled by specifically controlling the mixing ratio of the raw materials, the polyhydroxy compound and 1,2-naphthoquinonediazido-5- (and/or -4-)sulfonyl chloride. Since all the added 1,2-naphthoquinone diazido-5- (and/or -4-)sulfonyl chloride substantially completely participates in the esterification of the polyhydroxy compound, the molar ratio of the raw materials shall be controlled in order to obtain an ester mixture having a desired degree of esterification.

If necessary, the 1,2-naphthoquinonediazido-5-sulfonic acid ester and the 1,2-naphthoquinonediazido-4-sulfonic acid ester can be used together. Also, the reaction temperature in the foregoing reaction is usually from −20° C. to 60° C., and preferably from 0° C. to 40° C.

When the photosensitive compounds of the present invention synthesized by the method described above are used as a resin composition, the photosensitive compounds are compounded with an alkali-soluble resin singly or as a mixture of two or more kinds thereof and the compounding amount of the photosensitive compound is from 5 to 100 parts by weight, and preferably from 20 to 60 parts by weight to 100 parts by weight of the alkali-soluble resin. If the compounding amount is less than 5 parts by weight, the percentage film remaining is greatly lowered and if the compounding amount is over 100 parts by weight, the sensitivity and the solubility in a solvent are lowered.

As the alkali-soluble resin being used in the present invention, there are a novolak resin, an acetone-pyrogallol resin, polyhydroxystyrene, and the derivatives thereof.

In these alkali-soluble resins, a novolak resin is particularly preferred and the novolak resin is obtained by subjecting a definite monomer as the main component to an aldehyde by addition polycondensation in the presence of an acid catalyst.

As the definite monomer, cresols such as phenol, m-cresol, p-cresol, o-cresol, etc.; xylenols such as 2,5-xylenol, 3,5-xylenol, 3,4-xylenol, 2,3-xylenol, etc.; alkylphenols such as m-ethylphenol, p-ethylphenol, o-ethylphenol, p-t-butylphenol, etc.; trialkylphenols such as 2,3,5-trimethylphenol, 2,3,4-trimethylphenol, etc.; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, p-butoxyphenol, etc.; bisalkylphenols such as 2-methyl-4isopropylphenol, etc.; and hydroxyaromatic compounds such as m-chlorophenol, p-chlorophenol, o-chlorophenol, dihydroxybiphenyl, bisphenol A, phenylphenol, resorcinol, naphthol, etc., can be used singly or as a mixture thereof although the monomer being used in the present invention is not limited to these monomers.

As the aldehydes being used for forming the novolak resin, for example, formaldehyde, para-formaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, n-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and the acetal compounds thereof, such as chloroacetaldehyde diethyl acetal, etc., can be used, and in these compounds, formaldehyde is preferably used.

These aldehydes are used singly or as a mixture thereof.

As the acid catalyst for use in the addition polycondensation described above, hydrochloric acid, sulfuric acid, formic acid, acetic acid, oxalic acid, etc., can be used.

Also, the techniques disclosed in JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147, JP-A-4-122938, etc., that is, the novolak resins wherein low-molecular components were removed or reduced can be preferably used.

The weight-average molecular weight of the novolak resin thus obtained is preferably in the range of from 2,000 to 20,000. If the molecular weight is less than 2,000, the film reduction of the unexposed portions after development is large, while the molecular weight is over 20,000, the development speed is reduced. The particular preferred range of the average molecular weight is from 3,000 to 15,000. In this case, the weight-average molecular weight is defined by the polystyrene converted value of a gel permeation chromatography.

Also, the degree of dispersion (the ratio of a weight-average molecular weight Mw to a number-average molecular weight Mn, i.e., Mw/Mn) of a novolak resin is preferably from 1.5 to 7.0, and more preferably from 1.5 to 4.0. If the degree of dispersion is over 7, the effect of this invention that the layer thickness reliance is good is not obtained and of the degree of dispersion is less than 1.5, a high purifying step is required in the case of synthesizing the novolak resin, whereby the synthesis of the novolak resin is lacking in the reality for the practical use and is unsuitable.

In the present invention, the photosensitive material described above is used and, if necessary, the esterified product of the polyhydroxy compound shown below and 1,2-naphthoquinonediazido-5-(and/or -4-)sulfonyl chloride can be used together.

In this case, the ratio of the naphthoquinonediazide ester photosensitive material of the polyhydroxy compound to the photosensitive material of the present invention is preferably from 20/80 to 80/20 (by weight ratio). That is, if the content of the photosensitive material of the present invention is less than 20% by weight based on the total amount of the photosensitive materials in the photoresist composition, the effect of the present invention cannot sufficiently be obtained.

Examples of the polyhydroxy compound are polyhydroxybenzophenones such as 2,3,4-trihydroxybenzophenone, 2,4,4'-trihydroxybenzophenone, 2,4,6-trihydroxybenzophenone, 2,3,4'-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, 2,3,4,3',4',5'-hexahydroxybenzophenone, etc.; polyhydroxyphenyl alkyl ketones such as 2,3,4-trihydroxyacetophenone, 2,3,4-trihydroxyphenyl pentyl ketone, 2,3,4-trihydroxyphenyl hexyl ketone, etc.; bis[(poly)hydroxyphenyl]alkanes such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1, nordihydroguaiaretic acid, etc.; polyhydroxybenzoic acid esters such as propyl 3,4,5-trihydroxybenzoate, phenyl 2,3,4-trihydroxybenzoate, phenyl 3,4,5-trihydroxybenzoate, etc.; bis(polyhydroxybenzoyl)alkanes or bis(polyhydroxybenzoyl)aryls, such as bis(2,3,4-trihydroxybenzoyl)methane, bis(3-acetyl-4,5,6-trihydroxyphenyl)methane, bis(2,3,4-trihydroxybenzoyl)benzene, bis(2,4,6-trihydroxybenzoyl)benzene, etc.; alkylene-di-(polyhydroxy benzoates) such as ethylene glycol-di(3,5-dihydroxy benzoate), ethylene glycoldi(3,4,5-trihydroxy benzoate), etc.; polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, 2,3,4,2',3',4'-biphenylhexol, etc.; bis(polyhydroxy) sulfides such as 4,4'-thiobis(1,3-dihydroxy)benzene, etc.; bis(polyhydroxyphenyl) ethers such as 2,2',4,4'-tetrahydroxy diphenyl ether, etc; bis(polyhydroxyphenyl) sulfoxides such as 2,2',4,4'-tetrahydroxydiphenyl sulfoxide, etc.; bis(polyhydroxyphenyl) sulfones such as 2,2',4,4'-diphenyl sulfone, etc.; polyhydroxytriphenylmethanes such as tris(4-hydroxyphenyl)methane, 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,-2',3',4'-hexahydroxy-5.5'-diacetyltriphenylmethane, 2,3,4,2',3',4',3",4"-octahydroxy-5,5'-diacetyltriphenylmethane, 2,4,6,2',4',6'-hexahydroxy-5,5'-dipropionyltriphenylmethane, etc.; polyhydroxyspirobiindanes such as 3,3,3',3'-tetramethyl-1,1'-spirobiindane5,6,5',6'-tetrol, 3,3,3',3'-tetramethyl-1,1'-spirobiindane-5,6,7,5',6',7'-hexol, 3,3,3',3'-tetramethyl-1,1'-spirobiindane-4,5,6,4',5',6'-hexol, 3,3,3',3'-tetramethyl-1,1'-spirobiindane-4,5,6,5',6',7'-hexol, etc.; polyhydroxy phthalides such as 3,3-bis(3,4-dihydroxyphenyl) phthalide, 3,3-bis(2,3,4-trihydroxyphenyl) phthalide, 3',4',5',6'-tetrahydroxyspiro[phthalido-3,9'-xanthene], etc.; flavono dyes such as morin, kersetin, rutin, etc.; the polyhydroxy compounds described in JP-A-4-253058, such as α,α',α"-tris(4-hydroxyphenyl) 1,3,5-triisopropylbenzene, α,α',α"-tris(3,5-dimethyl-4-hydroxyphenyl) 1,3,5-triisopropylbenzene, α,α',α"-tris(3,5-diethyl-4-hydroxyphenyl) 1,3,5-triisopropylbenzene, α,α',α"-(tris(3,5-di-n-propyl-4-hydroxyphenyl) 1,3,5-triisopropylbenzene, α,α',α"-tris(3,5-diisopropyl-4-hydroxyphenyl) 1,3,5-triisopropylbenzene, α,α',α"-tris(3,5di-n-butyl-4-hydroxyphenyl) 1,3,5-triisopropylbenzene, α,α',α"-tris(3-methyl-4-hydroxyphenyl) 1,3,5-triisopropylbenzene, α,α',α"-tris(3-methoxy-4-hydroxyphenyl) 1,3,5-triisopropylbenzene, α,α',α"-tris(2,4-dihydroxyphenyl) 1,3,5-triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl)ethyl]benzene, 1-[α-methyl-α-(4'-hydroxyphenyl)ethyl]-3-[α,α'-bis(4"-hydroxyphenyl)ethyl]benzene, 1-[α-methyl-α(3',5'-dimethyl-4'-hydroxyphenyl)ethyl]-4-[α,α'-bis(3",5"-dimethyl-4"-hydroxyphenyl)ethyl]benzene, 1-[α-methyl-α-(3'-methyl-4'-hydroxyphenyl)ethyl]-4-[α,α'-bis(3"-methyl-4"-hydroxyphenyl)ethyl]benzene, 1-[α-methyl-α-(3'-methoxy-4'-hydroxyphenyl)ethyl]-4-[α',α'-bis(3"-methoxy-4"-hydroxyphenyl)ethyl]benzene, 1-[α-methyl-α-(2',4'-dihydroxyphenyl)ethyl]-4-[α',α'-bis(4"-hydroxyphenyl)ethyl]benzene, 1-[α-methyl-α-(2',4'-dihydroxyphenyl)ethyl]-3-[α",α'-bis(4"-hydroxyphenyl)ethyl]benzene, etc.; p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)p-xylene, α,α',α'-tris(2,3,4-trihydroxybenzoyl)mesitylene, 2,6-bis-(2'-hydroxy-3',5'-dimethylbenzyl)-p-cresol, 2,6-bis(2'-hydroxy-5'-methylbenzyl)-p-cresol, 2,6-bis(2'-hydroxy3',5'-di-t-butylbenzyl)-p-cresol, 2,6-bis(2'-hydroxy-5'-ethylbenzyl)-p-cresol, 2,6-bis(2',4'-dihydroxybenzyl)-p-cresol, 2,6-bis-(2'-hydroxy-3'-t-butyl-5'-methylbenzyl)-p-cresol, 2,6-bis-(2',3',4'-trihydroxy-5'-acetylbenzyl)-p-cresol, 2,6-bis(2',4',6'-trihydroxybenzyl)-p-cresol, 2,6-bis(2',3',4'-trihydroxybenzyl)-p-cresol, 2,6-bis(2',3',4'-trihydroxybenzyl)-3,5-dimethyl-phenol, 4,6-bis(4'-hydroxy-3',5'-dimethylbenzyl)-pyrogallol, 4,6-bis-(4'-hydroxy-3',5'-dimethoxybenzyl)-pyrogallol, 2,6-bis-(4'-hydroxy-3',5'-dimethylbenzyl)-1,3,4-trihydroxyphenol, 4,6-bis-(2',4',6'-trihydroxybenzyl)-2,4-dimethylphenol, and 4,6-bis-(2',3',4'-trihydroxybenzyl)-2,5-dimethylphenol.

Also, the low nuclide of a phenol resin, such as a novolak resin, etc., can be used.

The positive photoresist composition of the present invention can further contain a polyhydroxy compound for accelerating the dissolution thereof in a developer.

Examples of the polyhydroxy compound which can be preferably used for the foregoing purpose are phenols, resorcin, phloroglucin, 2,3,4-trihydroxybenzophenone, 2,3,4,4'-tetrahydroxybenzophenone, 2,3,4,3',4',5'-hexahydroxybenzophenone, an acetone-pyrogallol condensed resin, phloroglucide, 2,4,2',4'-biphenyltetrol, 4,4'-thiobis(1,3-dihydroxy)benzene, 2,2',4,4'-tetrahydroxy diphenyl ether, 2,2',4,4'-tetrahydroxydiphenyl sulfoxide, 2,2',4,4'-tetrahydroxydiphenyl sulfone, tris(4-hydroxyphenylmethane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4- hydroxyphenyl)hexane, 1,2-tetrakis(4-hydroxyphenyl)ethane, 1,1,3-tris(hydroxyphenyl)butane, and para[α,α,α',α'-tetrakis(4-hydroxyphenyl)]-xylene.

The polyhydroxy compound can be compounded in an amount of usually not more than 100 parts by weight, preferably not more than 70 parts by weight, and more preferably not more than 50 parts by weight per 100 parts by weight of the alkali-soluble resin.

As the solvent for dissolving the photosensitive material and the alkali-soluble resin in the present invention, there are ethylene glycol monomethyl ether, ethylene glycol monoethyl ether, methylcellosolve acetate, ethylcellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, etc.

The solvents can be used singly or as a combination of them.

Furthermore, the foregoing solvent can be used together with a high-boiling organic solvent such as N-methylformamide, N,N-dimethylformamide, N-methylacetamide, N,N-dimethylacetamide, N-methylpyrrolidone, dimethyl sulfoxide, benzyl ethyl ether, etc.

The positive photoresist composition of the present invention can further contain a surface active agent for improving the coating property such as a striation, etc.

As the surface active agent, there are, for example, nonionic surface active agents such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylallyl ethers (e.g., polyoxyethylene octylphenol ether, and polyoxyethylene nonylphenol ether), polyoxyethylenepolyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate), etc.; fluorine series surface active agents such as Eftop EF301, EF303, and EF352 (trade names, made by Sin Akita Kasei K.K.), Megafac F171 and F173 (trade names, made by Dainippon Ink and Chemicals, Inc.), Florad FC430 and FC431 (trade names, made by Sumitomo 3M Limited), Asahiguard AG710, Surflon S-382, SC101, SC102, SC103, SC104, SC105, and SC106 (trade names, made by Asahi Glass Co., Ltd.) etc.; and an organosiloxane polymer KP341 (trade name, made by Shin-Etsu Chemical Co., Ltd.); and acrylic acid series or methacrylic acid series copolymers, Polyflow No. 75 and No. 95 (trade names, made by Kyoei sha Yushi Kagaku Kogyo K.K.).

In these surface active agents, the fluorine series surface active agents and silicone series surface active agents are particularly preferred.

The compounding amount of the surface active agent is usually not more than 2 parts by weight, and preferably not more than 1 part by weight per 100 parts by weight of the alkali-soluble resin and the quinonediazide compound in the photoresist composition of the present invention.

These surface active agents can be added singly as a combination of them.

As the developer for the positive photoresist composition of the present invention, an aqueous solution of an alkali such as inorganic alkalis (e.g., sodium hydroxide, potassium hydroxide, sodium carbonate, sodium silicate, sodium metasilicate, and aqueous ammonia), primary amines (e.g., ethylamine and n-propylamine), secondary amines (e.g., diethylamine and di-n-butylamine), tertiary amines (e.g., triethylamine and methyldiethylamine), alcoholamines (e.g., dimethylethanolamine and triethanolamine), quaternary ammonium salts (e.g., tetramethylammonium hydroxide, tetraethylammonium hydroxide, and choline), and cyclic amines (e.g., pyrrole and piperidine).

Furthermore, the aqueous alkali solution described above can contain a proper amount of an alcohol such as isopropyl alcohol, etc., or a surface active agent such as a nonionic surface active agent.

The positive photoresist composition of the present invention can, if necessary, contain a light absorber, a crosslinking agent, an adhesion aid, etc.

The light absorber is added, if necessary, to the photoresist composition for the purposes of inhibiting the halation from the substrate and increasing the visualization in the case of coating the photoresist composition on a transparent substrate. As the light absorber, the commercially available light absorbers described, e.g., in *Kogyo yo Shikiso no Gijutu to Shijo (Techniques and Markets of Industrial Dyes)*, published by CMC and *Senryo Binran (Dye Handbook)*, edited by Yuuki Gosei Kagaku Kyokai, such as, for example, C.I. Disperse Yellow 1, 3, 4, 5, 7, 8, 13, 23, 31, 49, 50, 51, 54, 56, 60, 64, 66, 68, 79, 82, 88, 90, 93, 102, 114, and 124; C.I. Disperse Orange 1, 5, 13, 25, 29, 30, 31, 44, 57, 72, and 73; C.I. Disperse Red 1, 5, 7, 13, 17, 19, 43, 50, 54, 58, 65, 72, 73, 88, 117, 137, 143, 199, and 210; C.I. Disperse Violet 43; C.I. Disperse Blue 96; C.I. Fluorescent Brightening Agent 112, 135, and 163; C.I. Solvent Yellow 14, 16, 33, and 56; C.I. Solvent Orange 2 and 45; C.I. Solvent Red 1, 3, 8, 23, 24, 25, 27, and 49; C.I. Pigment Green 10; and C.I. Pigment Brown 2 can be suitably used.

The light absorber is compounded in an amount of usually not more than 100 parts by weight, preferably not more than 50 parts by weight, and more preferably not more than 30 parts by weight per 100 parts by weight of the alkali-soluble resin.

The crosslinking agent is added in the range of giving no influences on the formation of positive images. The purposes of the addition of the crosslinking agent are mainly for the improvement of the sensitivity control and the heat resistance, the improvement of the dry etching resistance, etc.

As examples of the crosslinking agent, there are the compounds obtained by acting formaldehyde to melamine, benzoguanamine, glycoluril, etc., the alkyl-denatured products of the foregoing compounds, epoxy compounds, aldehydes, azido compounds, organic peroxides, hexamethylenetetramine, etc.

The crosslinking agent is added in an amount of less than 10 parts by weight, and preferably less than 5 parts by weight to 100 parts by weight of the photosensitive material in the photoresist composition. If the amount of the crosslinking agent is over 10 parts by weight, the sensitivity is lowered and scum (the resist residue) forms, which are undesirable.

The adhesion aid is added for the purpose of improving the adhesion of the resist and the substrate, and particularly for preventing the resist from releasing in the etching step.

Specific examples of the adhesion aid are chlorosilanes such as trimethylchlorosilane, dimethylvinylchlorosilane, methyldiphenylchlorosilane, chloromethyldimethylchlorosilane, etc.; alkoxysilanes such as trimethylmethoxysilane, dimethyldiethoxysilane, methyldimethoxysilane, dimethylvinylethoxysilane, diphenyldimethoxysilane, phenyltriethoxysilane, etc.; silazanes such as hexamethylsilazane, N,N'-bis(trimethylsilyl)urea, dimethyltrimethylsilylamine, trimethylsilylimidazole, etc.; silanes such as vinyltrichlorosilane, γ-chloropropyltrimethoxysilane, γ-aminopropyltriethoxysilane, γ-glycidoxypropyltrimethoxysilane, etc.; heterocyclic compounds such as benzotriazole, benzimidazole, indazole, imidazole, 2-mercaptobenzimidazole, 2-mercaptobenzothiazole, 2-mercaptobenzoxazole, urazole, thiourasil, mercapoimidazole, mercaptopyrimidine, etc.; ureas such as 1,1-dimethylurea, 1,3-dimethylurea, etc., and thiourea compounds.

The adhesion aid is compounded in the amount of usually less than 10 parts by weight, and preferably less than 5 parts by weight per 100 parts by weight of the alkali-soluble resin.

A good resist can be obtained by coating the positive photoresist composition of the present invention described above on a substrate being used for the production of a precise integrated circuit element (e.g., a transparent substrate such as a silicon substrate coated with silicon oxide, a glass substrate, an ITO substrate, etc.) by a proper coating method such as a spinner, a coater, etc., followed by baking, light-exposing through a definite mask, if necessary, heating (PEB: pose exposure baking), developing, rinsing, and drying.

Then, the examples of the present invention but the invention is not limited to them. In addition, in these examples, % is by weight unless otherwise indicated.

SYNTHESIS EXAMPLE 1

Synthesis of 1,1,3-tris(2-methyl-4-hydroxy-5-cyclohexylphenyl)butane (Compound [I-4]):

76.1 g of 2-cyclohexyl-5-methylphenol, 85.0 g of methanol and 0.1 g of n-octylmercaptan were put into a reactor and heated up to 70° C. while hydrogen chloride gas was introduced thereinto. With continuing the introduction of hydrogen chloride gas into the reactor, 8.9 g of crotonaldehyde were dropwise added thereto. After the addition, these were stirred for 5 hours at the elevated temperature. 64 g of mineral spirit and 10 g of heptane were added to these, from which methanol and hydrochloric acid were removed under reflux. 120 g of mineral spirit were further added and heptane was removed by distillation. Then, hydrochloric acid was completely removed at 100° C. and at reduced pressure of 100 mmHg. After cooled, the crystals formed were filtered out and washed fully with water. The thus-obtained crystals were recrystallized from xylene and then from methanol. Thus, the above-entitled product was obtained.

SYNTHESIS EXAMPLE 2

Synthesis of 1,1,3-tris(2-cyclohexyl-4-hydroxy-5-methylphenyl)butane (Compound [I-3]):

The above-entitled product was obtained in the same manner as in Synthesis Example 1, except that 2-cyclohexyl-5-methylphenol was replaced by 2-methyl-5-cyclohexylphenol.

SYNTHESIS EXAMPLE 3

Synthesis of 1,1,3-tris(2,5-dimethyl-4-hydroxyphenyl)butane (Compound [III]):

86.8 g of 2,5-xylenol, 75.0 g of methyl alcohol and 55.8 g of 36% hydrochloric acid were put into a reactor, and 16.6 g of crotonaldehyde were dropwise added thereto over a period of 2 hours while stirring at 65° C. After the addition, these were reacted at 65° to 75° C. for 5 hours. After cooled to room temperature, the reaction product was filtered out, washed with toluene and dried to obtain the product having the following structure:

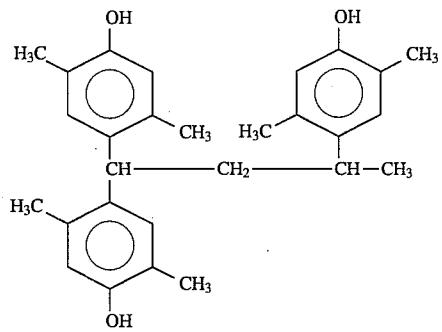

SYNTHESIS EXAMPLE 4

Synthesis of Photosensitive Material (a):

31.3 g of Compound [I-4] obtained in Synthesis Example 1, 26.9 g of 1,2-naphthoquinonediazido-5-sulfonyl chloride and 400 ml of acetone were put into a three-neck flask and dissolved uniformly. Next, a mixture of triethylamine/acetone (=10.6 g/50 ml) was gradually and dropwise added thereto and reacted at 25° C. for 3 hours. The reaction mixture was poured into 1500 ml of an aqueous solution of 1% hydrochloric acid, and the precipitate formed was filtered out, washed with water and dried (at 40° C.) to obtain 40.7 g of 1,2-naphthoquinonediazido-5-sulfonate of 1,1,3-tris(2-methyl-4-hydroxy-5-cyclohexylphenyl)butane (photosensitive material (a)).

SYNTHESIS EXAMPLE 5

Synthesis of Photosensitive Material (b):

31.3 g of Compound [I-3] obtained in Synthesis Example 2, 25.5 g of 1,2-naphthoquinonediazido-5-sulfonyl chloride and 400 ml of acetone were put into a three-neck flask and dissolved uniformly. Next, a mixture of triethylamine/acetone (=10.1 g/50 ml) was gradually and dropwise added thereto and reacted at 25° C. for 3 hours. The reaction mixture was poured into 1500 ml of an aqueous solution of 1% hydrochloric acid, and the precipitate formed was filtered out, washed with water and dried (at 40° C.) to obtain 38.6 g of 1,2-naphthoquinonediazido-5-sulfonate of 1,1,3-tris(2-cyclohexyl-4-hydroxy-5-methylphenyl)butane (photosensitive material (b)).

SYNTHESIS EXAMPLE 6

Synthesis of Photosensitive Material (c):

20.9 g of Compound (III) obtained in Synthesis Example 3, 28.2 g of 1,2-naphthoquinonediazido-5-sulfonyl chloride and 300 ml of acetone were put into a three-neck flask and dissolved uniformly. Next, a mixture of triethylamine/acetone (=11.2 g/50 ml) was gradually and dropwise added thereto and reacted at 25° C. for 3 hours. The reaction mixture was poured into 1500 ml of an aqueous solution of 1% hydrochloric acid, and the precipitate formed was filtered out, washed with water and dried (at 40° C.) to obtain 34.3 g of 1,2-naphthoquinonediazido-5-sulfonate of 1,1,3- tris(2,5-dimethyl-4-hydroxyphenyl)butane (photosensitive material (c)).

SYNTHESIS EXAMPLE 7

Synthesis of Photosensitive Material (d):

12.3 g of 2,3,4,4'-tetrahydroxybenzophenone, 40.3 g of 1,2-naphthoquinonediazido-5-sulfonyl chloride and 300 ml of acetone were put into a three-neck flask and dissolved uniformly. Next, a mixture of triethylamine/acetone (=15.2 g/50 ml) was gradually and dropwise added thereto and reacted at 25° C. for 3 hours. The reaction mixture was poured into 1500 ml of an aqueous solution of 1% hydrochloric acid, and the precipitate formed was filtered out, washed with water and dried (at 40° C.) to obtain 39.7 g of 1,2-naphthoquinonediazido-5-sulfonate of 2,3,4,4'-tetrahydroxybenzophenone (photosensitive material (d)).

SYNTHESIS EXAMPLE 8

Synthesis of Photosensitive Material (e):

42.5 g of α,α,α'-tris(4-hydroxyphenyl)-1-ethyl-4-isopropylbenzene, 61.8 g of 1,2-naphthoquinonediazido-5-sulfonyl chloride and 650 ml of acetone were put into a three-neck flask and dissolved uniformly. Next, a mixture of triethylamine/acetone (=24.4 g/80 ml) was gradually and dropwise added thereto and reacted at 25° C. for 4 hours. The reaction mixture was poured into 2500 ml of an aqueous solution of 1% hydrochloric acid, and the precipitate formed was filtered out, washed with water and dried (at 40° C.) to obtain 83.1 g of 1,2-naphthoquinonediazido-5-sulfonate of α,α,α'-tris(4-hydroxyphenyl)-1-ethyl-4-isopropylbenzene (photosensitive material (e)).

SYNTHESIS EXAMPLE 9

Synthesis of Photosensitive Material (f):

30.8 g of 2,2-bis[4-hydroxy-3,5-di(4-hydroxybenzyl)phenyl]propane, 53.8 g of 1,2-naphthoquinonediazido-5-sulfonyl chloride and 600 ml of acetone were put into a three-neck flask and dissolved uniformly. Next, a mixture of triethylamine/acetone (=21.3 g/50 ml) was gradually and dropwise added thereto and reacted at 25° C. for 6 hours. The reaction mixture was poured into 2500 ml of an aqueous solution of 1% hydrochloric acid, and the precipitate formed was filtered out, washed with water and dried (at 40° C.) to obtain 67.2 g of 1,2-naphthoquinonediazido-5-sulfonate of 2,2-bis[4-hydroxy-3,5-di(4-hydroxybenzyl)phenyl]propane (photosensitive material (f)).

SYNTHESIS EXAMPLE 10

Synthesis of Novolak Resin (A):

40 g of m-cresol, 60 g of p-cresol, 49 g of an aqueous solution of 37% formalin and 0.13 g of oxalic acid were put into a three-neck flask, heated up to 100° C. and reacted at the elevated temperature for 15 hours, while stirring.

Afterwards, this was further heated up to 200° C. and the pressure in the flask was gradually reduced to 5 mmHg, by which water, the non-reacted monomers, formaldehyde and oxalic acid were removed. Next, the molten alkali-soluble novolak resin was cooled to room temperature and collected. The thus-obtained novolak resin (A) had a weight-average molecular weight of 7100 (in terms of polystyrene).

SYNTHESIS EXAMPLE 11

Synthesis of Novolak Resin (B):

50 g of m-cresol, 25 g of p-cresol, 28 g of 2,5-xylenol, 53 g of an aqueous solution of 37% formalin and 0.15 g of oxalic acid were put into a three-neck flask, heated up to 100° C. and reacted at the elevated temperature for 11 hours, while stirring.

Afterwards, this was further heated up to 200° C. and the pressure in the flask was gradually reduced to 1 mmHg, by which water, the non-reacted monomers, formaldehyde and oxalic acid were removed by distillation. Next, the molten novolak resin was cooled to room temperature and collected. The thus-obtained novolak resin had a weight-average molecular weight of 4300 (in terms of polystyrene). Next, 20 g this novolak resin were completely dissolved in 60 g of methanol, and 30 g of water were gradually added thereto while stirring, by which the resin component was precipitated. The upper layer was removed by decantation, and the precipitated resin was collected, heated at 40° C. and dried under reduced pressure for 24 hours to obtain alkalisoluble novolak resin (B). The thus-obtained novolak resin had a weight-average molecular weight of 8920 (in terms of polystyrene). The contents of monomer, dimer and trimer in the resin were 0%, 2.3% and 3.5%, respectively. By the fractional re-precipitation, 47% of the low-molecular components were removed.

SYNTHESIS EXAMPLE 12

Synthesis of Novolak Resin (C):

60 g of m-cresol, 20 g of p-cresol, 25 g of 2,3,5-trimethylphenol, 56 g of an aqueous solution of 37% formalin and 0.16 g of oxalic acid were put into a three-neck flask, heated up to 100° C. and reacted at the elevated temperature for 16 hours, while stirring.

Afterwards, this was further heated up to 200° C. and the pressure in the flask was gradually reduced to 1 mmHg, by which water, the non-reacted monomers, formaldehyde and oxalic acid were removed by distillation. Next, the molten novolak resin was cooled to room temperature and collected. The thus-obtained novolak resin had a weight-average molecular weight of 3800 (in terms of polystyrene). Next, 20 g this novolak resin were completely dissolved in 60 g of acetone, and 60 g of hexane were gradually added thereto while stirring. This was allowed to statically stand as it was for 2 hours, then the upper layer was removed by decantation, and the precipitated resin was collected, heated at 40° C. and dried under reduced pressure for 24 hours to obtain alkali-soluble novolak resin (C). The thus-obtained novolak resin had a weight-average molecular weight of 8300 (in terms of polystyrene) and had a degree of dispersion of 3.20. The contents of monomer, dimer and trimer in the resin were 0%, 2.1% and 3.0%, respectively. By the fractional re-precipitation, 56% of the low-molecular components were removed.

SYNTHESIS EXAMPLE 13

Synthesis of Novolak Resin (D):

30 g of p-cresol, 14 g of o-cresol, 50 g of 2,3-dimethylphenol, 20 g of 2,3,5-trimethylphenol and 4.9 g of 2,6-dimethylphenol were mixed with 50 g of diethylene glycol monomethyl ether and put into a three-neck flask equipped with a stirrer, a reflux condenser and a thermometer. Next, 85 g of an aqueous solution of 37% formalin were added thereto and stirred while heating on an oil bath at 110° C. When the internal temperature reached 90° C., 6.3 g of oxalic acid dihydrate were added thereto. Afterwards, the reaction was continued for 18 hours while the temperature of the oil bath was kept at 130° C. Then, the reflux condenser was removed, and the content in the flask was distilled at 200° C. under reduced pressure to remove thee non-reacted monomers. The thus-obtained novolak resin had a weight-average molecular weight of 3280 (in terms of polystyrene) and had a degree of dispersion of 2.75.

EXAMPLES 1 TO 10 AND COMPARATIVE EXAMPLES 1 TO 7

Preparation and Evaluation of Positive Photoresist Compositions:

After mixing each of the photosensitive materials (a) to (f) obtained by the Synthesis Examples 4 to 9 described above, each of the novolak resins A to D obtained by the Synthesis Examples 10 to 13, each solvent, and, if necessary, each polyhydroxy compound at the ratio shown in Table 1 below and forming each uniform solution, the solution was filtered using a Teflon-made micro filter having pore sizes of 0.10 μm to provide each photoresist composition.

TABLE 1

Formulation of Positive Photoresist Composition

| | Novolak Resin | | Photo-sensitive Material | | Poly-hydroxy Compound | | Solvent | |
|---|---|---|---|---|---|---|---|---|
| | (a) | (b) | (a) | (b) | (a) | (b) | (a) | (b) |
| Ex. 1 | A | 100 | a | 27 | — | — | S-1 | 350 |
| Ex. 2 | A | 100 | b | 27 | — | — | S-2 | 380 |
| Ex. 3 | B | 81 | a | 28 | P-2 | 19 | S-2/S-4 | 285/95 |
| Ex. 4 | B | 79 | b | 32 | P-1 | 21 | S-1 | 380 |
| Ex. 5 | B | 77 | a/e | 16/16 | P-1 | 23 | S-2 | 380 |
| Ex. 6 | C | 79 | a/f | 17/13 | P-3 | 21 | S-2 | 370 |
| Ex. 7 | C | 81 | a | 27 | P-1 | 19 | S-2/S-4 | 285/95 |
| Ex. 8 | C | 78 | b | 31 | P-3 | 22 | S-1 | 340 |
| Ex. 9 | D | 82 | a | 30 | P-1 | 18 | S-1 | 340 |
| Ex. 10 | D | 85 | b | 28 | P-3 | 15 | S-1 | 340 |
| Comp. 1 | A | 100 | d | 27 | — | — | S-1 | 350 |
| Comp. 2 | A | 100 | e | 27 | — | — | S-1 | 350 |
| Comp. 3 | A | 100 | f | 26 | — | — | S-2 | 380 |
| Comp. 4 | A | 100 | c | 28 | — | — | S-2 | 380 |
| Comp. 5 | B | 79 | c | 31 | P-1 | 21 | S-2 | 370 |
| Comp. 6 | B | 79 | f | 31 | P-3 | 21 | S-2 | 380 |
| Comp. 7 | C | 78 | e | 29 | P-2 | 22 | S-1 | 350 |

(a): Kind;
(b): Addition amount
Ex. 1 to Ex. 10 Examples of the present invention
Comp. 1 to Comp. 7 Comparative examples
P-1: α,α,α'-Tris(4-hydroxyphenyl)-1-ethyl-4-isopropylbenzene
P-2: Tris(4-hydroxyphenyl)methane
P-3: 1,1-Bis(4-hydroxyphenyl)cyclohexane
S-1: Ethylcellosolve acetate
S-2: Ethyl 2-hydroxypropionate
S-3: Methyl 3-methoxypropionate
S-4: Ethyl 3-ethoxypropionate Each photoresist composition was coated on a silicon wafer using a spinner at a changed rotation number and dried for 60 seconds at 90° C. by a vacuum adsorption type hot plate to form each of the resist layers having a thicknesses of 0.97 μm and 1.02 μm, respectively.

After exposing each layer using a reducing projection exposure apparatus, NSR-2005i9C, manufactured by Nikon Corporation, PEB was carried out for 60 seconds at 110° C., the exposed layer was developed with an aqueous solution of 2.38% tetramethylammonium hydroxide for one minute, washed with water for 30 seconds, and dried.

Each of the resist patterns on the silicon wafers thus formed was observed by a scanning type electron microscope and the resist was evaluated. The results obtained are shown in Table 2 below.

In the evaluations:

The sensitivity was defined as the reciprocal of the exposure amount of reproducing a mask pattern of 0.60 μm and shown by the relative value to the sensitivity of the resist layer of 1.02 μm in thickness in Comparative Example 1.

The resolving power was shown by the limiting resolving power in the exposure amount of reproducing the mask patten of 0.60 μm.

The heat resistance was shown by the temperature at which the silicon wafer having formed thereon the resist pattern was baked on a hot plate for 4 minutes and the pattern was not changed.

The form of the resist was shown by the angle (θ) formed by the wall surface of the resist and the surface of the silicon wafer at the cross section of the resist pattern of 0.50 μm.

The development residue was determined by observing the silicon wafer having formed thereon the resist pattern by a scanning type electron microscope. The sample wherein the residue was not observed was shown by A and the sample wherein the residue was observed was shown by C.

As to the storage stability, the solution of each positive photoresist composition was allowed to stand at room temperature and after 6 months, the presence of precipitates in the solution was determined. The sample wherein any precipitates were not observed was shown by A and the sample wherein precipitates were observed was shown by C.

TABLE 2

Evaluation Result of Resist Performance

| No. | Relative Sensitivity Layer Thickness | | Resolving Power Layer Thickness | | Heat Resistance Layer Thickness | Resist Form Layer Thickness | | Development Residue | Storage Stability |
|---|---|---|---|---|---|---|---|---|---|
| | 0.97 | 1.02 | 0.97 (μm) | 1.02 (μm) | 0.97 (°C.) | 0.97 (θ) | 1.02 (θ) | | |
| Ex. 1 | 1.1 | 1.2 | 0.32 | 0.32 | 150 | 89 | 89 | A | A |
| Ex. 2 | 1.2 | 1.3 | 0.32 | 0.32 | 150 | 88 | 88 | A | A |
| Ex. 3 | 1.2 | 1.3 | 0.30 | 0.30 | 160 | 89 | 89 | A | A |
| Ex. 4 | 1.2 | 1.3 | 0.30 | 0.30 | 160 | 88 | 88 | A | A |
| Ex. 5 | 1.1 | 1.2 | 0.30 | 0.30 | 160 | 89 | 89 | A | A |
| Ex. 6 | 1.2 | 1.3 | 0.30 | 0.30 | 160 | 88 | 88 | A | A |
| Ex. 7 | 1.1 | 1.3 | 0.30 | 0.30 | 160 | 88 | 89 | A | A |

TABLE 2-continued

| | Evaluation Result of Resist Performance | | | | | | | |
|---|---|---|---|---|---|---|---|---|
| | Relative Sensitivity | | Resolving Power Layer Thickness | | Heat Resistance Layer Thickness | Resist Form Layer Thickness | | Development | Storage |
| | Layer Thickness | | 0.97 | 1.02 | 0.97 | 0.97 | 1.02 | | |
| No. | 0.97 | 1.02 | (μm) | (μm) | (°C.) | (θ) | (θ) | Residue | Stability |
| Ex. 8 | 1.1 | 1.2 | 0.28 | 0.28 | 160 | 88 | 89 | A | A |
| Ex. 9 | 1.1 | 1.2 | 0.28 | 0.28 | 160 | 89 | 89 | A | A |
| Ex. 10 | 1.1 | 1.3 | 0.28 | 0.28 | 160 | 88 | 88 | A | A |
| Comp. 1 | 0.9 | 1.0 | 0.42 | 0.42 | 140 | 83 | 82 | A | C |
| Comp. 2 | 0.7 | 0.8 | 0.40 | 0.40 | 140 | 87 | 86 | A | A |
| Comp. 3 | 1.0 | 1.1 | 0.42 | 0.42 | 150 | 86 | 86 | A | C |
| Comp. 4 | 0.9 | 1.0 | 0.32 | 0.35 | 150 | 86 | 86 | A | C |
| Comp. 5 | 0.9 | 1.0 | 0.32 | 0.35 | 160 | 87 | 86 | A | C |
| Comp. 6 | 1.0 | 1.1 | 0.35 | 0.38 | 150 | 86 | 85 | A | C |
| Comp. 7 | 1.0 | 1.1 | 0.32 | 0.35 | 160 | 86 | 86 | A | C |

As described above, it can be seen that the positive photoresists using the photosensitive materials of the present invention are excellent in the sensitivity and the resolving power and, in particular, show the less layer thickness reliance of the performance thereof, form no development residue, and are excellent in the storage stability.

While the invention has been described in detail and with reference to specific embodiments thereof, it will be apparent to one skilled in the art that various changes and modifications can be made therein without departing from the spirit and scope thereof.

What is claimed is:

1. A positive photoresist composition comprising an alkali-soluble resin and a photosensitive compound in admixture, wherein the photosensitive composition is a 1,2-naphthoquinonediazido-5-(and/or -4-)sulfonic acid ester of a polyhydroxy compound, and wherein the polyhydroxy compound is represented by the following formula (I):

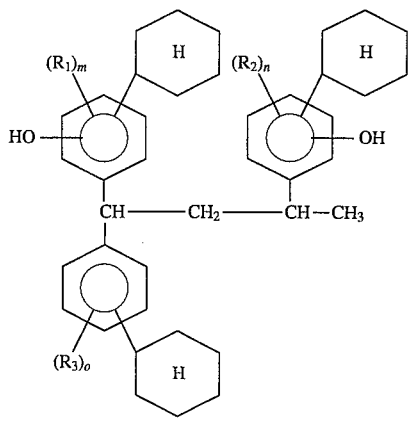

(I)

wherein $R_1$ to $R_3$ may be the same or different and each represents a hydrogen atom, a halogen atom, a hydroxyl group, an alkyl group, or an alkoxy group; and m, n and o each represent an integer of from 1 to 3.

2. A positive photoresist composition as in claim 1, wherein the polyhydroxy compound represented by formula (I) is selected from the group consisting of the following compounds:

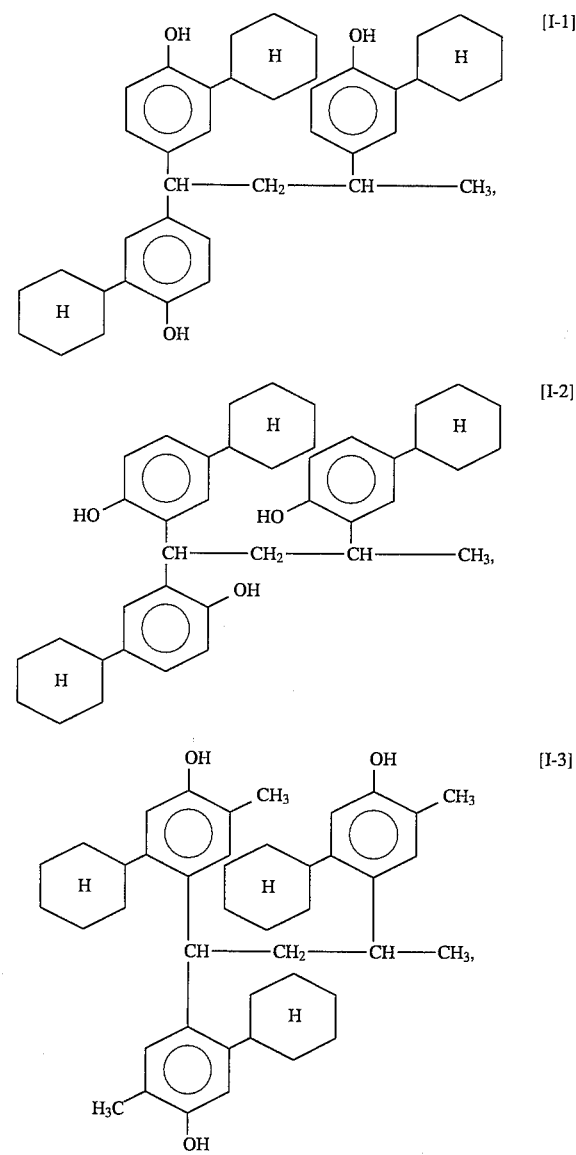

-continued

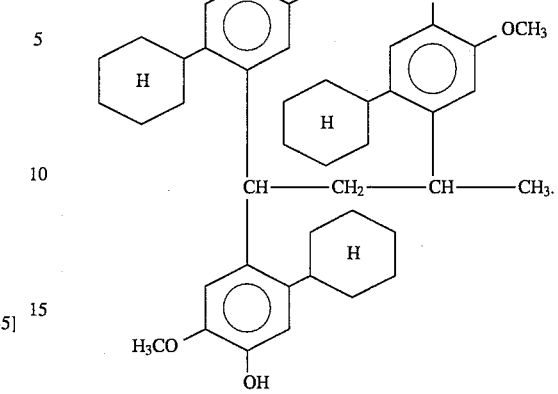

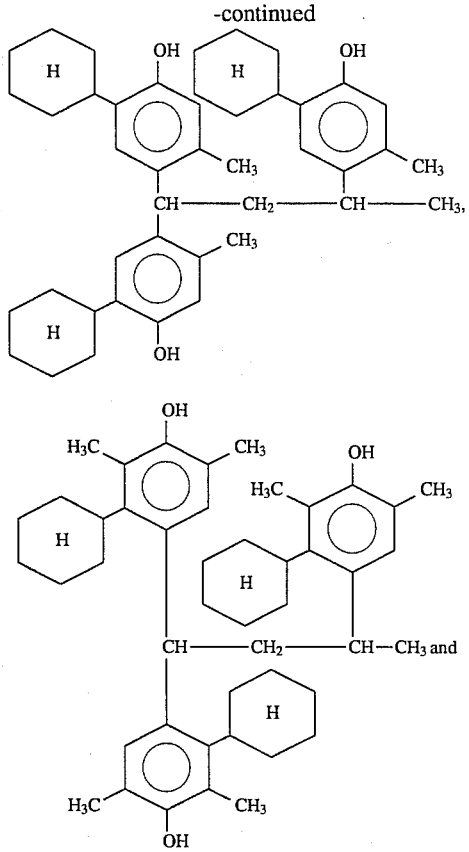

3. A positive photoresist composition as in claim 1, wherein the photosensitive compound is present in an amount of from 5 to 100 parts by weight per 100 parts by weight of the alkali-soluble resin.

4. A positive photoresist composition as in claim 1, wherein the photosensitive compound is present in an amount of from 20 to 60 parts by weight per 100 parts by weight of the alkali-soluble resin.

5. A positive photoresist composition as in claim 1, wherein the alkali-soluble resin is a novolak resin.

6. A positive photoresist composition as in claim 1, further comprising a polyhydroxy compound.

* * * * *